US012591377B2

(12) United States Patent
Kim

(10) Patent No.: US 12,591,377 B2
(45) Date of Patent: Mar. 31, 2026

(54) MEMORY MODULE CAPABLE OF REDUCING POWER CONSUMPTION AND SEMICONDUCTOR SYSTEM INCLUDING THE SAME

(71) Applicant: SK hynix Inc., Icheon-si (KR)

(72) Inventor: Jung Hyun Kim, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 36 days.

(21) Appl. No.: 17/216,292

(22) Filed: Mar. 29, 2021

(65) Prior Publication Data

US 2021/0216224 A1 Jul. 15, 2021

Related U.S. Application Data

(62) Division of application No. 15/884,693, filed on Jan. 31, 2018, now Pat. No. 10,990,301.

(30) Foreign Application Priority Data

Feb. 28, 2017 (KR) ........................ 10-2017-0026345
Feb. 28, 2017 (KR) ........................ 10-2017-0026358

(51) Int. Cl.
*G06F 3/06* (2006.01)
*G06F 1/3234* (2019.01)
(Continued)

(52) U.S. Cl.
CPC .......... *G06F 3/0625* (2013.01); *G06F 1/3275* (2013.01); *G06F 1/3296* (2013.01);
(Continued)

(58) Field of Classification Search
CPC .... G06F 1/3296; G06F 1/3275; G06F 1/3225; G06F 3/0625; G06F 3/0634;
(Continued)

(56) References Cited

U.S. PATENT DOCUMENTS 4,961,167 A * 10/1990 Kumanoya ......... G11C 11/4074
365/222
6,714,473 B1 3/2004 Fiscus
(Continued)

FOREIGN PATENT DOCUMENTS

CN 1811986 A 8/2006
KR 1020010004581 A 1/2001
(Continued)

OTHER PUBLICATIONS

English translation of abstract for KR 1020060071473, "Semiconductor Memory Device with Low Power Consumption", Jun. 27, 2004, retrieved from https://www.kipo.go.kr/en/MainApp (Year: 2004).*

*Primary Examiner* — Ji H Bae
(74) *Attorney, Agent, or Firm* — WILLIAM PARK AND ASSOCIATES LTD.

(57) ABSTRACT

A memory module may include a power source, a memory device, and a power controller. The power source provides at least one power supply voltage. The memory device operates by being supplied with at least one memory power supply voltage. The power controller supplies the at least one memory power supply voltage by changing a voltage level of the at least one power supply voltage based on operation modes of the memory device.

25 Claims, 10 Drawing Sheets

(51) Int. Cl.

| | |
|---|---|
| *G06F 1/3296* | (2019.01) |
| *G11C 5/04* | (2006.01) |
| *G11C 5/14* | (2006.01) |
| *G11C 7/04* | (2006.01) |
| *G11C 11/40* | (2006.01) |
| *G11C 11/406* | (2006.01) |
| *G11C 11/4074* | (2006.01) |

(52) U.S. Cl.
CPC .......... *G06F 3/0634* (2013.01); *G06F 3/0679* (2013.01); *G11C 5/04* (2013.01); *G11C 7/04* (2013.01); *G11C 11/40* (2013.01); *G11C 11/406* (2013.01); *G11C 11/4074* (2013.01); *G11C 5/148* (2013.01); *G11C 11/40626* (2013.01); *Y02D 10/00* (2018.01)

(58) Field of Classification Search
CPC .......... G06F 3/0679; G11C 5/04; G11C 7/04; G11C 11/40; G11C 11/406; G11C 11/4074; G11C 5/148; G11C 11/40626; Y02D 10/00
USPC .................................................. 713/300, 323
See application file for complete search history.

(56) References Cited

U.S. PATENT DOCUMENTS

| | | | |
|---|---|---|---|
| 7,143,298 B2* | 11/2006 | Wells .................. G06F 11/1441 | |
| | | | 714/E11.138 |
| 7,166,900 B1 | 1/2007 | Mun et al. | |
| 7,330,388 B1 | 2/2008 | Chapman et al. | |
| 7,360,104 B2 | 4/2008 | Harris et al. | |
| 7,554,869 B2 | 6/2009 | Kim et al. | |
| 9,653,142 B1 | 5/2017 | Kihara | |
| 10,990,301 B2 | 4/2021 | Kim | |
| 2002/0097624 A1* | 7/2002 | Andersen ............. G11C 7/1072 | |
| | | | 365/222 |
| 2002/0149985 A1* | 10/2002 | Shimizu ................ G11C 11/406 | |
| | | | 365/222 |
| 2002/0191472 A1 | 12/2002 | Okamoto et al. | |
| 2003/0201673 A1 | 10/2003 | Sim et al. | |
| 2004/0125680 A1* | 7/2004 | Kim ...................... G11C 11/406 | |
| | | | 365/222 |
| 2005/0146973 A1 | 7/2005 | Schoenfeld | |
| 2005/0270880 A1 | 12/2005 | Hsu et al. | |
| 2007/0006000 A1 | 1/2007 | Jain et al. | |
| 2007/0194381 A1 | 8/2007 | Chun | |
| 2007/0288782 A1 | 12/2007 | Chang et al. | |
| 2008/0018377 A1 | 1/2008 | Chung | |
| 2008/0031066 A1 | 2/2008 | Nandi | |
| 2008/0082290 A1 | 4/2008 | Jeong et al. | |
| 2008/0137444 A1 | 6/2008 | Mair et al. | |
| 2008/0291969 A1 | 11/2008 | Chu | |
| 2009/0070612 A1* | 3/2009 | Adelman ................. G11C 5/04 | |
| | | | 711/E12.083 |
| 2010/0103760 A1 | 4/2010 | Mair et al. | |
| 2010/0138684 A1 | 6/2010 | Kim et al. | |
| 2011/0055538 A1* | 3/2011 | Cho ................... H04N 21/4436 | |
| | | | 713/323 |
| 2011/0316592 A1* | 12/2011 | Cook ...................... G11C 16/30 | |
| | | | 327/142 |
| 2012/0030482 A1 | 2/2012 | Russell et al. | |
| 2012/0243364 A1 | 9/2012 | Hacking et al. | |
| 2013/0094312 A1 | 4/2013 | Jang et al. | |
| 2013/0232365 A1 | 9/2013 | Nishijima | |
| 2013/0311801 A1 | 11/2013 | Kong et al. | |
| 2015/0256153 A1 | 9/2015 | Lim et al. | |
| 2015/0370313 A1 | 12/2015 | Tamura | |
| 2016/0343416 A1 | 11/2016 | Chang et al. | |
| 2017/0294216 A1 | 10/2017 | Doo et al. | |
| 2017/0315747 A1 | 11/2017 | Yang et al. | |
| 2018/0114562 A1 | 4/2018 | Lee | |
| 2019/0018468 A1 | 1/2019 | Kang et al. | |

FOREIGN PATENT DOCUMENTS

| | | | | |
|---|---|---|---|---|
| KR | 1020060071473 | * | 6/2006 | ....... G11C 11/40615 |
| KR | 1020060071473 A | | 6/2006 | |
| KR | 100605076 B1 | | 7/2006 | |
| KR | 1020070033669 A | | 3/2007 | |
| KR | 1020110093086 A | | 8/2011 | |

* cited by examiner

<u>221</u>

630

MEMORY MODULE CAPABLE OF REDUCING POWER CONSUMPTION AND SEMICONDUCTOR SYSTEM INCLUDING THE SAME

CROSS-REFERENCES TO RELATED APPLICATION

The present application is a divisional application of Ser. No. 15/884,693, filed on Jan. 31, 2018, and claims priority under 35 U.S.C. § 119(a) to Korean application number 10-2017-0026345, filed on Feb. 28, 2017 and Korean application number 10-2017-0026358, filed on Feb. 28, 2017 in the Korean Intellectual Property Office, which is incorporated herein by reference in its entirety.

BACKGROUND

1. Technical Field

Various embodiments generally relate to a semiconductor technology, and, more particularly, to a memory module and a semiconductor system including the same.

2. Related Art

An electronic apparatus includes a large number of electronic components. A computer system as an electronic apparatus includes many electronic components which are configured by semiconductors. In a typical computer device, a processor and memory are mounted on a main board including signal transmission lines and are configured to perform data communications. In the memory, a plurality of memory apparatuses configured as a module type is mounted to the main board. The computer device includes a power source such as a power management integrated circuit, and the memory module operates by being supplied with a plurality of power supply voltages from the power source. The memory module performs various operations, and there is an operation that needs all of the plurality of power supply voltages and an operation that needs only a part of the plurality of power supply voltages. However, since the memory module is always applied with fixed power supply voltages from the power source, unnecessary power consumption occurs.

SUMMARY

In an embodiment, a memory module may include a power source, memory device, and power controller. The power source may be configured to provide at least one power supply voltage. The memory device may be configured to operate by being supplied with the at least one memory power supply voltage. The power controller may be configured to supply the at least one memory power supply voltage by changing a voltage level of the at least one power supply voltage based on operation modes of the memory device.

In an embodiment, a memory module may include a power source, a memory device, a temperature sensor, and a power controller. The power source may be configured to provide at least one power supply voltage. The memory device may be configured to operate by being supplied with at least one memory power supply voltage. The temperature sensor may be configured to generate temperature information of the memory device. The power controller may be configured to change a voltage level of the at least one power supply voltage based on the temperature information to provide the at least one memory power supply voltage.

In an embodiment, a memory module may include a module substrate, a power source, a memory device, a temperature sensor, and a power controller. The power source may be disposed on the module substrate, and configured to provide at least one power supply voltage. The memory device may be configured to operate by being supplied with at least one memory power supply voltage. The temperature sensor may be disposed on the module substrate, and configured to provide temperature information of the memory device. The power controller may be configured to change a voltage level of the at least one power supply voltage based on at least one of operation modes of the memory device and the temperature information to provide the at least one memory power supply voltage.

DETAILED DESCRIPTION

Hereinafter, a memory module capable of reducing power consumption and a semiconductor system including the same will be described below with reference to the accompanying drawings through various example embodiments.

Figure 1:
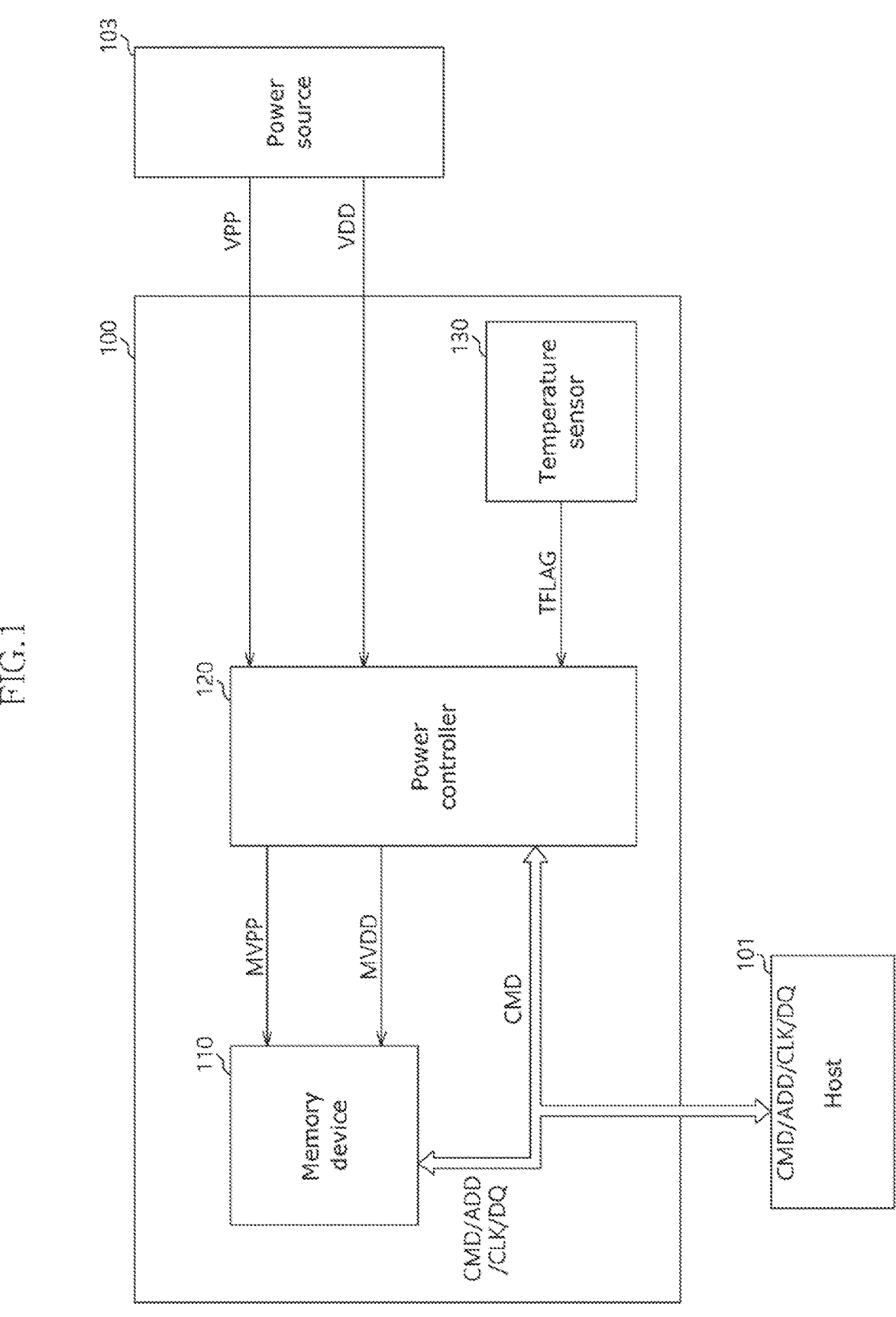
FIG. 1 is a diagram illustrating a representation of an example configuration of a semiconductor system in accordance with an embodiment.

FIG. 1 is a diagram illustrating a representation of an example configuration of a semiconductor system 1 in accordance with an embodiment. The semiconductor system 1 may include a host 101 and a memory module 100. The host 101 and the memory module 100 may perform data communications. The host 101 provides various control signals to the memory module 100 such that the memory module 100 may perform data input and output operations. For example, the host 101 may provide a command signal CMD, an address signal ADD, a clock signal CLK, and data DQ to the memory module 100, and may thereby control the memory module 100 to perform data storage and output operations. An operation in which data is transmitted from the host 101 to the memory module 100 and the transmitted data is stored in the memory module 100 may be a write operation. An operation in which data stored in the memory module 100 is outputted and the outputted data is transmitted to the host 101 may be a read operation. In the write operation, the host 101 may provide the command signal CMD, the address signal ADD, and the data DQ to the memory module 100. In the read operation, the host 101 may provide the command signal CMD and the address signal ADD to the memory module 100, and the memory module 100 may output the data DQ to the host 101. The host 101 and the memory module 100 may be coupled by a plurality of buses. The plurality of buses may include a command bus for transmitting the command signal CMD, an address bus for transmitting the address signal ADD, a data bus for transmitting the data DQ, and a clock bus for transmitting the clock signal CLK. In an embodiment, the command signal CMD and the address signal ADD may be transmitted as one signal. The host 101 may include a physical layer as an interface circuit for transmitting the command signal CMD, the address signal ADD, the clock signal CLK, and the data DQ. The host 101 may include a central processing unit (CPU), a graphic processing unit (GPU), a multimedia processor (MMP), a digital signal processor (DSP), or a memory controller. Furthermore, the host 101 may be realized in the form of a system-on-chip by combining processor chips having various functions, such as application processors (AP).

In FIG. 1, the memory module 100 may include at least one memory device 110 and a power controller 120. While only one memory device 110 is shown in FIG. 1, it is to be noted that the memory module 100 may include a plurality of memory devices. Also, the memory module 100 may include not only the same kind of memory devices but may also include different kinds of memory devices. The memory device 110 may include a volatile memory or a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM), or an FRAM (ferroelectric RAM). In the write operation, the memory device 110 may receive the command signal CMD, the address signal ADD, the clock signal CLK, and the data DQ transmitted from the host 101. In the read operation, the memory device 110 may receive the command signal CMD, the address signal ADD, and the clock signal CLK transmitted from the host 101, and may transmit the data DQ to the host 101.

The power controller 120 may provide power supply voltages appropriate for the memory device 110 to operate. The power controller 120 may receive a first power supply voltage VPP and a second power supply voltage VDD. The power controller 120 may generate a first memory power supply voltage MVPP from the first power supply voltage VPP, and may generate a second memory power supply voltage MVDD from the second power supply voltage VDD. The power controller 120 may output or supply the first and second memory power supply voltages MVPP and MVDD to the memory device 110, and the memory device 110 may operate by being supplied with the first and second memory power supply voltages MVPP and MVDD.

The semiconductor system 1 may further include a power source 103. The power source 103 acting as a component of the semiconductor system 1 may be in a power management integrated circuit capable of generating and providing various power supply voltages. The power source 103 may generate the first power supply voltage VPP and the second power supply voltage VDD. The second power supply voltage VDD may have a lower level than the first power supply voltage VPP. The first power supply voltage VPP may be a high voltage or a pumping voltage, and may be a voltage to be supplied to an internal circuit operating with a relatively high voltage level among the internal circuits of the memory device 110. For example, the first power supply voltage VPP may be used in a circuit such as a word line driver. The second power supply voltage VDD acting as a normal power supply voltage may be used in the remaining internal circuits other than the internal circuit using the first power supply voltage VPP. While it is shown in FIG. 1 that the power source 103 is disposed outside the memory module 100, in an embodiment, the power source 103 may be disposed inside a memory module 100 acting as a component of the memory module 100.

The power controller 120 may change the levels of power supply voltages to be supplied to the memory device 110 or selectively supply power supply voltages to the memory device 110, based on operation state information of the memory device 110. The operation state information of the memory device 110 may include operation information and temperature information of the memory device 110. The operation information of the memory device 110 may include information on the operation mode of the memory device 110 and a specific operation performed during the operation mode. The temperature information may include information on a temperature at which the memory device 110 operates. The power controller 120 may receive the first and second power supply voltages VPP and VDD from the power source 103, and may change the levels of the first and second memory power supply voltages MVPP and MVDD and provide the level-changed first and second memory power supply voltages MVPP and MVDD to the memory device 110 or may selectively provide at least one of the first and second memory power supply voltages MVPP and MVDD to the memory device 110, depending on the operation state information of the memory device 110.

The memory device 110 may perform various operations. For example, the memory device 110 may perform a normal operation, a standby operation, and a refresh operation based on the command signal CMD. The normal operation may include an active operation, a write operation, and a read operation. The active operation may be an operation in which the memory device 110 is activated to perform the write operation and the read operation. The standby operation as an operation in which the memory device 110 does not perform the write operation and the read operation and is deactivated may be an operation in which power consumption is minimized. For example, the standby operation may include an operation mode such as a power-down mode, a deep power-down mode, and a sleep mode. The memory device 110 may periodically perform a refresh operation during the standby operation by being controlled by the host 101. The standby operation may include a first standby operation and a second standby operation. The first standby operation as a low power operation mode may be an operation mode in which the memory device 110 does not perform the write operation or the read operation. During the first standby operation, the memory device 110 may perform the refresh operation by periodically receiving a refresh command as the command signal CMD from the host 101. Therefore, during the first standby operation, internal circuits for performing a refresh operation of the memory device 110 may need to operate, and the other internal circuits may not need to operate. The second standby operation may be a lowest power operation mode, and the memory device 110 may not even perform the refresh operation during the second standby operation. Thus, all of the internal circuits of the memory device 110 may not need to operate.

In normal operation of the memory device 110, the power controller 120 may provide the first and second power supply voltages VPP and VDD received from the power source 103 as they are, as the first and second memory power supply voltages MVPP and MVDD. In the first standby operation of the memory device 110, the power controller 120 may supply the first memory power supply voltage MVPP having substantially the same level as the first power supply voltage VPP and may supply the second memory power supply voltage MVDD having a lower level than the second power supply voltage VDD. Alternatively, in the first standby operation, the power controller 120 may supply the second memory power supply voltage MVDD having substantially the same level as the second power supply voltage VDD and may block the first power supply voltage VPP from being supplied as the first memory power supply voltage MVPP.

When the refresh operation is performed during the first standby operation, the power controller 120 may supply the first power supply voltage VPP as the first memory power supply voltage MVPP. During the first standby operation, the power controller 120 may block the first memory power supply voltage MVPP from being supplied to the memory device 110, and each time the memory device 110 periodically performs the refresh operation, the power controller 120 may provide the first power supply voltage VPP to the memory device 110 as the first memory power supply voltage MVPP. In the second standby operation of the memory device 110, the power controller 120 may block the first power supply voltage VPP from being supplied as the first memory power supply voltage MVPP, and may supply the second memory power supply voltage MVDD having a lower level than the second power supply voltage VDD.

The power controller 120 may change the levels of power supply voltages to be supplied to the memory device 110, depending on temperature information of the memory device 110. When the memory device 110 operates at a relatively lower temperature than a reference temperature such as a room temperature, because degradation is relatively small, the memory device 110 may exhibit relatively higher performance. When the memory device 110 operates at a relatively higher temperature than the reference temperature, because degradation is relatively large, the memory device 110 may exhibit relatively lower performance. Therefore, when operating at a relatively low temperature, the memory device 110 may exhibit normal performance even using power supply voltages having relatively low levels. Conversely, when operating at a relatively high temperature, the memory device 110 may exhibit normal performance using only power supply voltages having relatively high levels. Thus, the power controller 120 may change the levels of the first and second memory power supply voltages MVPP and MVDD to be supplied to the memory device 110, based on the temperature information of the memory device 110. The memory module 100 may further include a temperature sensor 130, and the temperature sensor 130 may generate a temperature flag TFLAG based on temperature information of the memory device 110 and provide the temperature flag TFLAG to the power controller 120.

Figure 2:
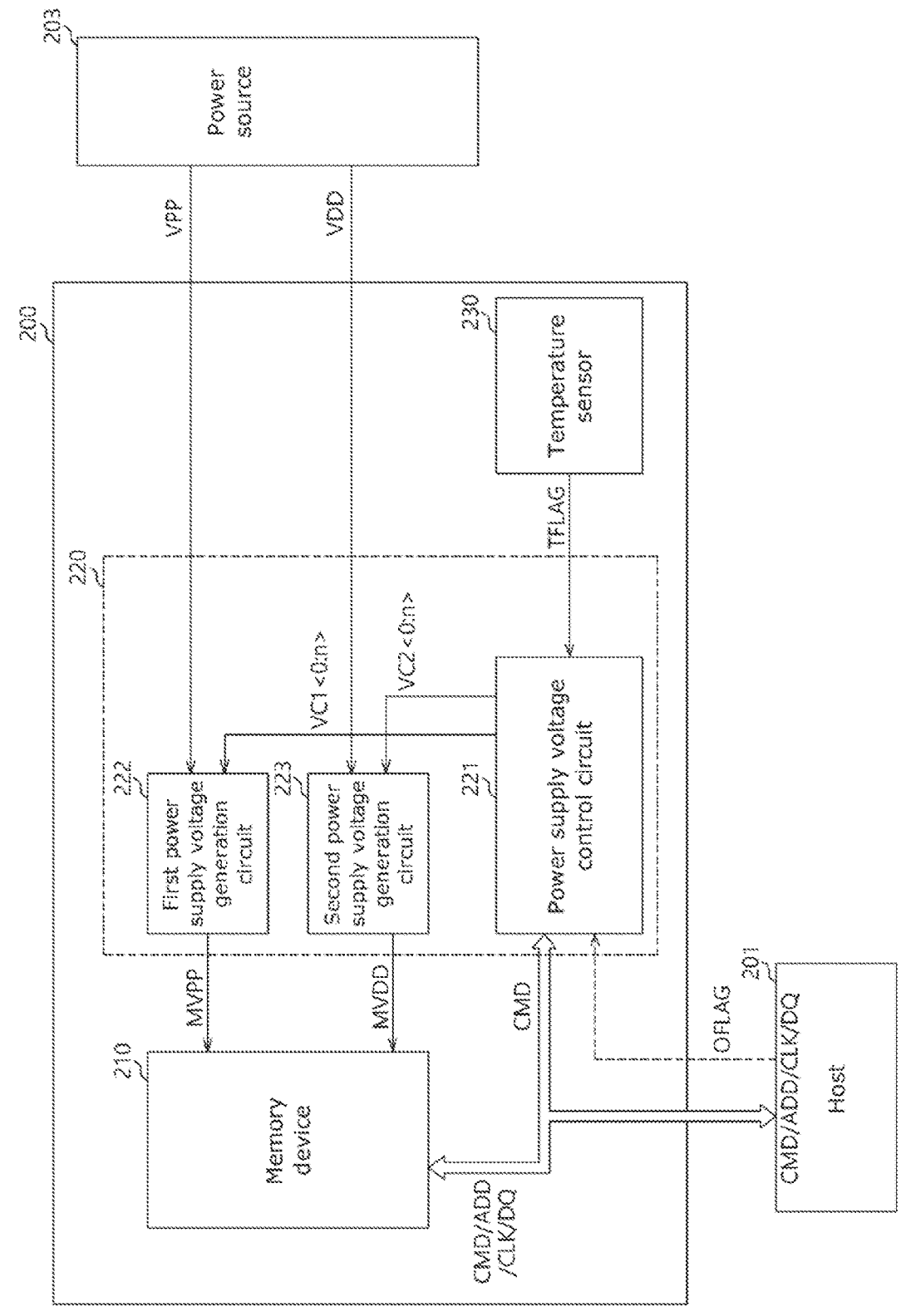
FIG. 2 is a diagram illustrating a representation of an example configuration of a semiconductor system in accordance with an embodiment.

FIG. 2 is a diagram illustrating a representation of an example configuration of a semiconductor system 2 in accordance with an embodiment. The semiconductor system 2 may include a host 201 and a memory module 200. The host 201 and the memory module 200 may perform data communications. The host 201 provides a command signal CMD, an address signal ADD, a clock signal CLK, and data DQ to the memory module 200 such that the memory module 200 may perform data input and output operations. The memory module 200 may include at least one memory device 210 and a power controller 220. While only one memory device 210 is shown in FIG. 2, it is to be noted that the memory module 200 may include a plurality of memory devices. In a write operation, the memory device 210 may receive the command signal CMD, the address signal ADD, the clock signal CLK, and the data DQ transmitted from the host 201. In a read operation, the memory device 210 may receive the command signal CMD, the address signal ADD, and the clock signal CLK transmitted from the host 201, and may transmit data DQ to the host 201.

The power controller 220 may provide power supply voltages appropriate for the memory device 210 to operate. The power controller 220 may be applied as the power controller 120 shown in FIG. 1. The power controller 220 may receive a first power supply voltage VPP and a second power supply voltage VDD. The power controller 220 may generate a first memory power supply voltage MVPP from the first power supply voltage VPP, and may generate a second memory power supply voltage MVDD from the second power supply voltage VDD. The power controller 220 may output or supply the first and second memory power supply voltages MVPP and MVDD to the memory device 210, and the memory device 210 may operate by being supplied with the first and second memory power supply voltages MVPP and MVDD. The power controller 220 may change the levels of power supply voltages to be supplied to the memory device 210, based on operation state information of the memory device 210. The semiconductor system 2 may further include a power source 203. The power source 203 acting as a component of the semiconductor system 2 may be in a power management integrated circuit capable of generating and providing various power supply voltages. The power source 203 may generate the first power supply voltage VPP and the second power supply voltage VDD. While it is shown in FIG. 2 that the power source 203 is disposed outside the memory module 200, in an embodiment, the power source 203 may be disposed inside the memory module 200 acting as a component of the memory module 200.

The power controller 220 may generate the first and second memory power supply voltages MVPP and MVDD by changing levels of the first and second power supply voltages VPP and VDD depending on operation state information of the memory device 210. In a normal operation of the memory device 210, the power controller 220 may supply the first memory power supply voltage MVPP having substantially the same level as the first power supply voltage VPP and may supply the second memory power supply voltage MVDD having substantially the same level as the second power supply voltage VDD. In normal operation of the memory device 210, the power controller 220 may output the first power supply voltage VPP as the first memory power supply voltage MVPP, and may output the second power supply voltage VDD as the second memory power supply voltage MVDD. In a first standby operation of the memory device 210, the power controller 220 may supply the first memory power supply voltage MVPP having substantially the same level as the first power supply voltage VPP and may supply the second memory power supply voltage MVDD having a lower level than the second power supply voltage VDD. In the first standby operation of the memory device 210, the power controller 220 may output the first power supply voltage VPP as the first memory power supply voltage MVPP, and may lower the second power supply voltage VDD a predetermined amount and output the lowered second power supply voltage VDD as the second memory power supply voltage MVDD. In a second standby operation of the memory device 210, the power controller 220 may block the first power supply voltage VPP from being supplied as the first memory power supply voltage MVPP, and may supply the second memory power supply voltage MVDD having a lower level than the second power supply voltage VDD. In the second standby operation of the memory device 210, the power controller 220 may block the first power supply voltage VPP from being provided as the first memory power supply voltage MVPP, and may drop the second power supply voltage VDD a predetermined amount and output the lowered second power supply voltage VDD as the second memory power supply voltage MVDD. Instead of not providing the first power supply voltage VPP as the first memory power supply voltage MVPP, the power controller 220 may provide a low voltage as the first memory power supply voltage MVPP in the second standby operation of the memory device 210. The low voltage may be a voltage which is applied to prevent internal circuits of the memory device 210 from receiving a floated first memory power supply voltage MVPP. The low voltage may be, for example, a ground voltage or a certain voltage having a lower level than the first power supply voltage VPP. The low voltage may be generated by dropping a level of the first power supply voltage VPP.

When the memory module 200 includes a plurality of memory devices, the power controller 220 may receive respective operation state information concerning the plurality of memory devices. The power controller 220 may supply different memory power supply voltages MVPP and MVDD to the plurality of memory devices depending on the respective operation state information concerning the plurality of memory devices. For example, when the memory module 200 includes a first memory device and a second memory device, the power controller 220 may supply third and fourth memory power supply voltages to the first memory device, and may supply fifth and sixth memory power supply voltages to the second memory device. The first memory device may perform the normal operation and the second memory device performs the first standby operation. The power controller 220 may output the first power supply voltage VPP as the third memory power supply voltage, and may output the second power supply voltage VDD as the fourth memory power supply voltage. Also, the power controller 220 may output the first power supply voltage VPP as the fifth memory power supply voltage, and may drop the second power supply voltage VDD by a predetermined level and output the lowered second power supply voltage VDD as the sixth memory power supply voltage.

The temperature information of the memory device 210 may be information obtained by measuring the temperature of the memory device 210 and/or the memory module 200. For example, the temperature information may include information on whether the temperature of the memory device 210 and/or the memory module 200 is a first temperature, a second temperature, or a third temperature. For example, the second temperature may be a temperature lower than the first temperature, and the third temperature may be a temperature higher than the first temperature. The first temperature may be a room temperature, the second temperature may be a cold temperature, and the third temperature may be a hot temperature. When the memory device 210 exhibits reference performance at the first temperature, because degradation of a semiconductor device is relatively small at the second temperature, the memory device 210 may exhibit higher performance than the preference performance at the second temperature. Therefore, the memory device 210 may exhibit the reference performance even by using power supply voltages having relatively low levels. Because degradation of a semiconductor device may easily occur at the third temperature, the memory device 210 may exhibit lower performance than the reference performance at the third temperature. Therefore, the memory device 210 may exhibit reference performance only by using power supply voltages having relatively high levels.

When the temperature of the memory device 210 is the first temperature, the power controller 220 may supply the first memory power supply voltage MVPP having substantially the same level as the first power supply voltage VPP. When the temperature of the memory device 210 is the first temperature, the power controller 220 may output the first power supply voltage VPP as the first memory power supply voltage MVPP. When the temperature of the memory device 210 is the second temperature, the power controller 220 may supply the first memory power supply voltage MVPP having a lower level than the first power supply voltage VPP. When the temperature of the memory device 210 is the second temperature, the power controller 220 may lower the first power supply voltage VPP a predetermined amount and output the lowered first power supply voltage VPP as the first memory power supply voltage MVPP. When the temperature of the memory device 210 is the third temperature, the power controller 220 may supply the first memory power supply voltage MVPP having a higher level than the first power supply voltage VPP. Further, the first power supply voltage VPP may have a higher level than the second power supply voltage VDD. When the temperature of the memory device 210 is the third temperature, the power controller 220 may raise the first power supply voltage VPP a predetermined amount and output the raised first power supply voltage VPP as the first memory power supply voltage MVPP. The power controller 220 may supply the second memory power supply voltage MVDD having substantially the same level as the second power supply voltage VDD, regardless of the temperature of the memory device 210. The power controller 220 may output the second power supply voltage VDD as the second memory power supply voltage MVDD. In an embodiment, the power controller 220 may supply the second memory power supply voltage MVDD having a lower level than the second power supply voltage VDD if the memory device 210 is the second temperature, and may supply the second memory power supply voltage MVDD having a higher level than the second power supply voltage VDD if the memory device 210 is the third temperature.

The power controller 220 may generate operation state information by receiving at least one of the command signal CMD, an operation flag OFLAG, and a temperature flag TFLAG. The command signal CMD or the operation flag OFLAG may include all information concerning an operation to be performed by the memory device 210. In an embodiment, the power controller 220 may obtain from the host 201 about information concerning the operation mode of the memory device 210 based on the command signal CMD. In an embodiment, the power controller 220 may generate the operation state information based on the operation flag OFLAG instead of the command signal CMD. The operation flag OFLAG as a signal including information on an operation to be performed by the memory device 210 may be a signal which may be separately transmitted from the host 201. The operation flag OFLAG may provide information about the operation mode of the memory device 210, in replacement of the command signal CMD. When the operation flag OFLAG is used, the power controller 220 may possibly not include a command decoder for analyzing the command signal CMD, and thus, a burden in designing the circuit of the power controller 220 may be alleviated. The temperature flag TFLAG may include information concerning the temperature of the memory device 210 and/or the memory module 200. The memory module 200 may further include a temperature sensor 230. The temperature sensor 230 may measure the temperature of the memory device 210 and/or the memory module 200, and may generate the temperature flag TFLAG based on the measured temperature.

In FIG. 2, the power controller 220 may include a power supply voltage control circuit 221, a first power supply voltage generation circuit 222, and a second power supply voltage generation circuit 223. The power supply voltage control circuit 221 may generate the operation state information by receiving one of the command signal CMD, the operation flag OFLAG, and the temperature flag TFLAG. The power supply voltage control circuit 221 may generate a first voltage control signal VC1<0:n> and a second voltage control signal VC2<0:n> based on the operation state information. Each of the first and second voltage control signals VC1<0:n> and VC2<0:n> may be a code signal which includes a plurality of bits, and n may be an integer greater than or equal to 1. The first power supply voltage generation circuit 222 may receive the first power supply voltage VPP, and may generate the first memory power supply voltage MVPP by changing the level of the first power supply voltage VPP based on the first voltage control signal VC1<0:n>. The second power supply voltage generation circuit 223 may receive the second power supply voltage VDD, and may generate the second memory power supply voltage MVDD by changing the level of the second power supply voltage VDD based on the second voltage control signal VC2<0:n>.

Figure 3:
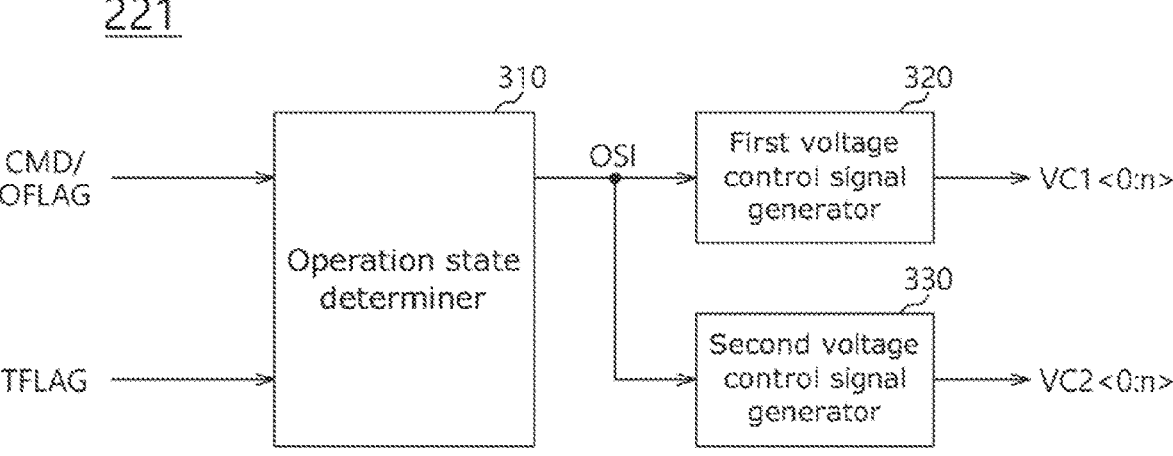
FIG. 3 is a diagram illustrating a representation of an example configuration of the power supply voltage control circuit shown in FIG. 2.

FIG. 3 is a diagram illustrating a representation of an example configuration of the power supply voltage control circuit 221 shown in FIG. 2. In FIG. 3, the power supply voltage control circuit 221 may include an operation state determiner 310, a first voltage control signal generator 320, and a second voltage control signal generator 330. The operation state determiner 310 may generate operation state information OSI based on at least one of the command signal CMD, the operation flag OFLAG, and the temperature flag TFLAG. For example, the operation state information OSI may be a code signal which includes a plurality of bits. The operation state determiner 310 may generate operation state information OSI including various information associated with the operation mode of the memory device 210 and information on the temperature of the memory device 210 and/or the memory module 200, by changing the logic values of the plurality of bits.

The first voltage control signal generator 320 may generate the first voltage control signal VC1<0:n> based on the operation state information OSI. The first voltage control signal generator 320 may generate the first voltage control signal VC1<0:n> having any one among an up code value, a default code value, a down code value, and a minimum code value. The second voltage control signal generator 330 may generate the second voltage control signal VC2<0:n> based on the operation state information OSI. The second voltage control signal generator 330 may generate the second voltage control signal VC2<0:n> having any one of a default code value and a down code value. In an embodiment of the present disclosure, because the power controller 220 does not raise the second power supply voltage VDD or does not block the second power supply voltage VDD from being provided as the second memory power supply voltage MVDD, the second voltage control signal generator 330 does not generate the second voltage control signal VC2<0:n> having an up code value or a minimum code value. However, depending on an application, the power controller 220 may raise the second power supply voltage VDD or block the second power supply voltage VDD from being provided as the second memory power supply voltage MVDD, and the second voltage control signal generator 330 may generate the second voltage control signal VC2<0:n> having an up code value or a minimum code value.

The first power supply voltage generation circuit 222 may raise the first power supply voltage VPP based on the first voltage control signal VC1<0:n> having an up code value, and may output the raised first power supply voltage VPP as the first memory power supply voltage MVPP. The first power supply voltage generation circuit 222 may output the first power supply voltage VPP as the first memory power supply voltage MVPP, based on the first voltage control signal VC1<0:n> having a default code value. The first power supply voltage generation circuit 222 may lower the first power supply voltage VPP based on the first voltage control signal VC1<0:n> having a down code value, and may output the lowered first power supply voltage VPP as the first memory power supply voltage MVPP. The first power supply voltage generation circuit 222 may block the first power supply voltage VPP from being provided as the first memory power supply voltage MVPP, based on the first voltage control signal VC1<0:n> having a minimum code value. The first power supply voltage generation circuit 222 may block the first power supply voltage VPP from being provided as the first memory power supply voltage MVPP, and may provide the low voltage as the first memory power supply voltage MVPP. When the low voltage has a lower level than the first power supply voltage VPP and higher than the ground voltage, the first power supply voltage generation circuit 222 may drop the first power supply voltage VPP and generate the lowered first power supply voltage VPP as the low voltage. The second power supply voltage generation circuit 223 may output the second power supply voltage VDD as the second memory power supply voltage MVDD, based on the second voltage control signal VC2<0:n> having a default code value. The second power supply voltage generation circuit 223 may lower the second power supply voltage VDD based on the second voltage control signal VC2<0:n> having a down code value, and may output the lowered second power supply voltage VDD as the second memory power supply voltage MVDD.

Figure 4:
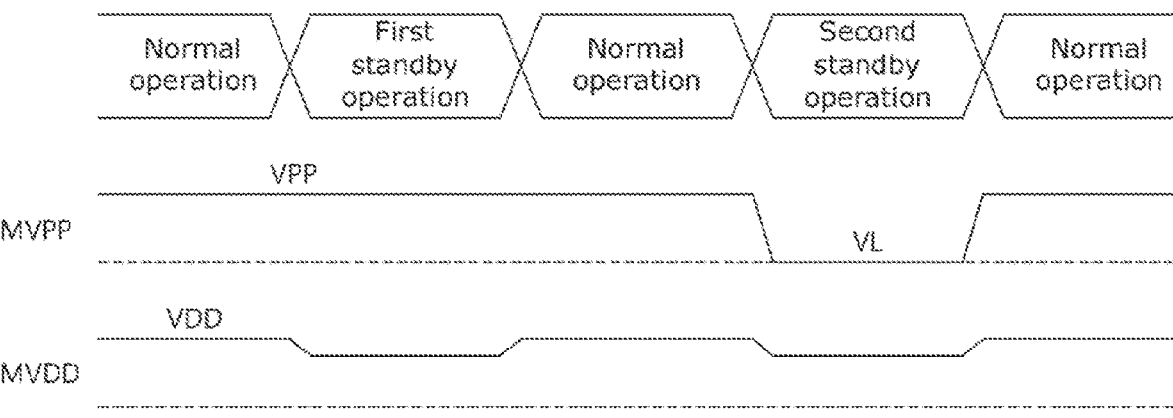
FIGS. 4 and 5 are representations of example timing diagrams to assist in an explanation of operations of the memory module in accordance with an embodiment.
Figure 5:
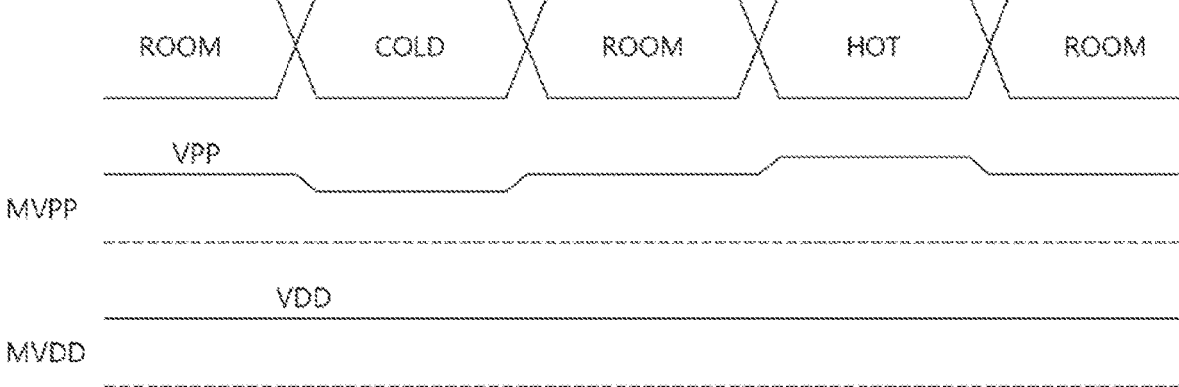

FIGS. 4 and 5 are representations of example timing diagrams to assist in an explanation of operations of the semiconductor system 2 and the memory module 200 in accordance with an embodiment. The operations of the semiconductor system 2 and the memory module 200 in accordance with an embodiment will be described below with reference to FIGS. 2 to 5. First, FIG. 4 shows an operating method of the memory module 200 according to various operations of the memory device 210. When the memory device 210 performs a normal operation, the power controller 220 may supply the first memory power supply voltage MVPP having substantially the same level as the first power supply voltage VPP and may supply the second memory power supply voltage MVDD having substantially the same level as the second power supply voltage VDD. The operation state determiner 310 may generate the operation state information OSI based on the command signal CMD or the operation flag OFLAG, the first voltage control signal generator 320 may generate the first voltage control signal VC1<0:n> having a default code value, and the second voltage control signal generator 330 may generate the second voltage control signal VC2<0:n> having a default code value. The first power supply voltage generation circuit 222 may output the first power supply voltage VPP as the first memory power supply voltage MVPP, and the second power supply voltage generation circuit 223 may output the second power supply voltage VDD as the second memory power supply voltage MVDD.

When the memory device 210 enters the first standby operation, the power controller 220 may supply the first memory power supply voltage MVPP having substantially the same level as the first power supply voltage VPP and may supply the second memory power supply voltage MVDD having a lower level than the second power supply voltage VDD. The operation state determiner 310 may generate the operation state information OSI based on the command signal CMD or the operation flag OFLAG, the first voltage control signal generator 320 may generate the first voltage control signal VC1<0:n> having a default code value, and the second voltage control signal generator 330 may generate the second voltage control signal VC2<0:n> having a down code value. The first power supply voltage generation circuit 222 may output the first power supply voltage VPP as the first memory power supply voltage MVPP, and the second power supply voltage generation circuit 223 may lower the second power supply voltage VDD and output the lowered second power supply voltage VDD as the second memory power supply voltage MVDD. Therefore, during the first standby operation, because the memory device 210 receives the first memory power supply voltage MVPP having substantially the same level as the first power supply voltage VPP, the memory device 210 may stably perform a refresh operation. Because the internal circuits not associated with the refresh operation receive the lowered second power supply voltage VDD, the power consumed in the memory device 210 may be reduced.

When the memory device 210 enters the second standby operation, the power controller 220 does not supply the first memory power supply voltage MVPP and may supply the second memory power supply voltage MVDD having a lower level than the second power supply voltage VDD. The operation state determiner 310 may generate the operation state information OSI based on the command signal CMD or the operation flag OFLAG, the first voltage control signal generator 320 may generate the first voltage control signal VC1<0:n> having a minimum code value, and the second voltage control signal generator 330 may generate the second voltage control signal VC2<0:n> having a down code value. The first power supply voltage generation circuit 222 may block the first power supply voltage VPP from being provided as the first memory power supply voltage MVPP, and may provide a low voltage VL as the first memory power supply voltage MVPP. Also, the second power supply voltage generation circuit 223 may lower the second power supply voltage VDD and may output the lowered second power supply voltage VDD as the second memory power supply voltage MVDD. Therefore, during the second standby operation, the power consumed by the memory device 210 may be minimized.

FIG. 5 is a diagram showing the operation of the memory module 200 depending on the temperature of the memory device 210 and/or the memory module 200. When the temperature of the memory device 210 and/or the memory module 200 is room temperature ROOM, the power controller 220 may supply the first memory power supply voltage MVPP having substantially the same level as the first power supply voltage VPP and may supply the second memory power supply voltage MVDD having substantially the same level as the second power supply voltage VDD. The operation state determiner 310 may generate operation state information OSI based on the temperature flag TFLAG, the first voltage control signal generator 320 may generate the first voltage control signal VC1<0:n> having a default code value, and the second voltage control signal generator 330 may generate the second voltage control signal VC2<0: n> having a default code value. The first power supply voltage generation circuit 222 may output the first power supply voltage VPP as the first memory power supply voltage MVPP, and the second power supply voltage generation circuit 223 may output the second power supply voltage VDD as the second memory power supply voltage MVDD.

When the temperature of the memory device 210 and/or the memory module 200 is a low temperature COLD, the power controller 220 may supply the first memory power supply voltage MVPP having a lower level than the first power supply voltage VPP and may supply the second memory power supply voltage MVDD having substantially the same level as the second power supply voltage VDD. The operation state determiner 310 may generate operation state information OSI based on the temperature flag TFLAG, the first voltage control signal generator 320 may generate the first voltage control signal VC1<0:n> having a down code value, and the second voltage control signal generator 330 may generate the second voltage control signal VC2<0: n> having a default code value. The first power supply voltage generation circuit 222 may lower the first power supply voltage VPP and output the lowered first power supply voltage VPP as the first memory power supply voltage MVPP, and the second power supply voltage generation circuit 223 may output the second power supply voltage VDD as the second memory power supply voltage MVDD. Therefore, the memory device 210 may exhibit reference performance while consuming less power by being supplied with power supply voltages having lower levels.

When the temperature of the memory device 210 and/or the memory module 200 is a high temperature HOT, the power controller 220 may supply the first memory power supply voltage MVPP having a higher level than the first power supply voltage VPP and may supply the second memory power supply voltage MVDD having substantially the same level as the second power supply voltage VDD. The operation state determiner 310 may generate the operation state information OSI based on the temperature flag TFLAG, the first voltage control signal generator 320 may generate the first voltage control signal VC1<0:n> having an up code value, and the second voltage control signal generator 330 may generate the second voltage control signal VC2<0:n> having a default code value. The first power supply voltage generation circuit 222 may raise the first power supply voltage VPP and output the raised first power supply voltage VPP as the first memory power supply voltage MVPP, and the second power supply voltage generation circuit 223 may output the second power supply voltage VDD as the second memory power supply voltage MVDD. Therefore, the memory device 210 may exhibit reference performance by being supplied with power supply voltages having higher levels. While operation of the memory module 200 depending on various operations or the temperature of the memory device 210 is independently described with reference to FIGS. 4 and 5, it is to be noted that the embodiment is not limited thereto. The operation of the memory module 200 depending on various operations of the memory device 210 and operation of the memory module 200 depending on the temperature of the memory device 210 may be applied in an overlapping manner. The power controller 220 may provide, to the memory device 210, the first and second memory power supply voltages MVPP and MVDD having optimum levels in consideration of both the various operations and the temperature of the memory device 210.

Figure 6:
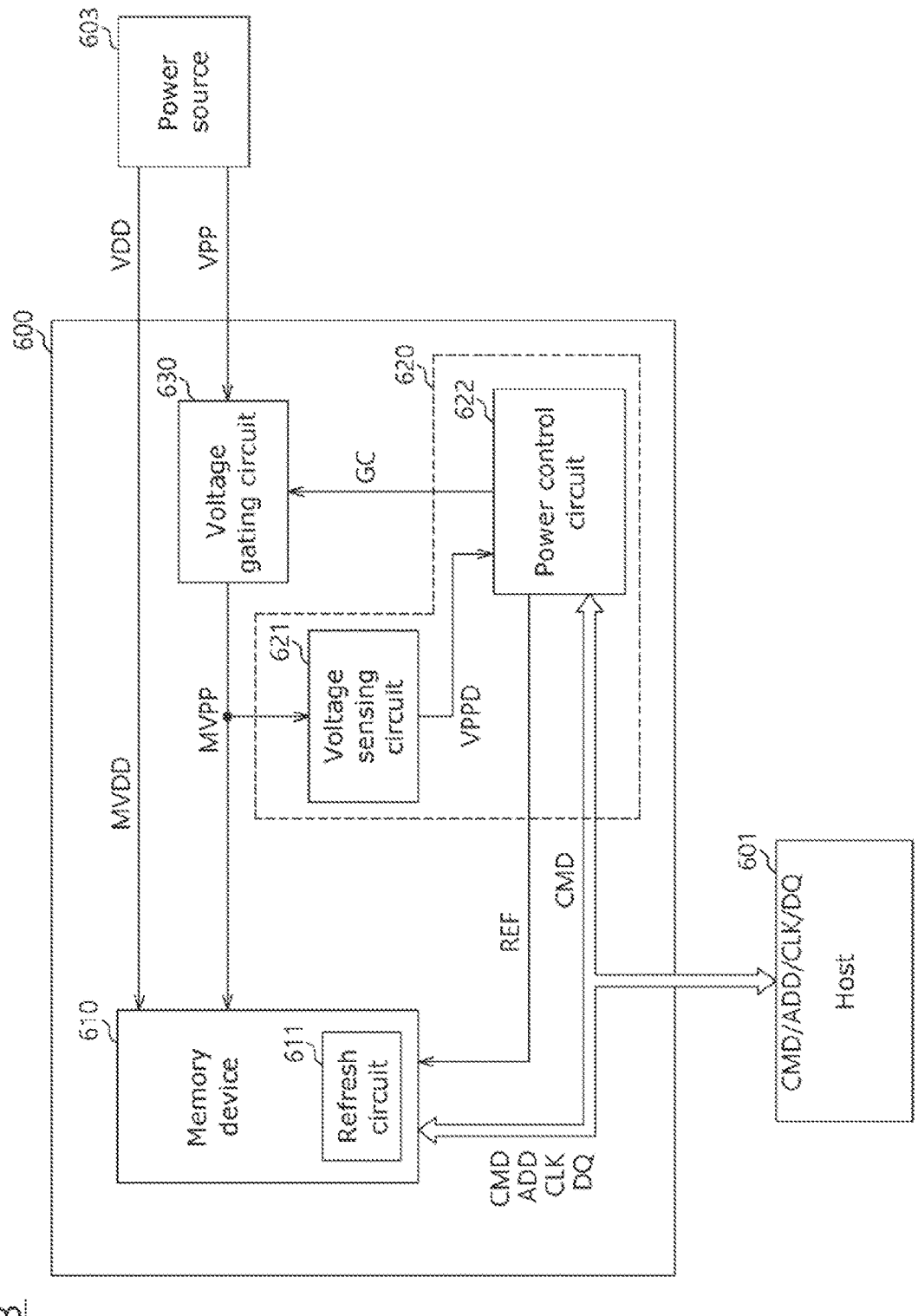
FIG. 6 is a diagram illustrating a representation of an example configuration of a semiconductor system in accordance with an embodiment.

FIG. 6 is a diagram illustrating a representation of an example configuration of a semiconductor system 3 in accordance with an embodiment. The semiconductor system 3 may include a host 601 and a memory module 600. The host 601 and the memory module 600 may perform data communication. The host 601 provides various control signals to the memory module 600 such that the memory module 600 may perform data input and output operations. For example, the host 601 may provide a command signal CMD, an address signal ADD, a clock signal CLK, and data DQ to the memory module 600, and may thereby control the memory module 600 to perform data storage and output operations. The memory module 600 may include at least one memory device 610. While only one memory device 610 is shown in FIG. 6, it is to be noted that the memory module 600 may include a plurality of memory devices.

The memory module 600 may control whether to supply power supply voltages to the memory device 610, depending on operation state information of the memory device 610. The host 601 may control the memory device 610 of the memory module 600 to perform various operations, and the memory device 610 may perform the various operations based on the command signal CMD. The memory device 610 may perform an active operation, a standby operation, a write operation, a read operation, and a refresh operation based on the command signal CMD. During the standby operation, because the memory device 610 is deactivated, the other internal circuits other than internal circuits for periodically performing the refresh operation may not operate. The standby operation may correspond to the aforementioned first standby operation. The memory device 610 may operate by being applied with a first memory power supply voltage MVPP. The memory module 600 may supply a first power supply voltage VPP supplied from an exterior, as the first memory power supply voltage MVPP, during the active operation of the memory device 610. The memory module 600 may block the first power supply voltage VPP from being supplied as the first memory power supply voltage MVPP, in the standby operation of memory device 610. The memory module 600 may supply the first power supply voltage VPP as the first memory power supply voltage MVPP, in the refresh operation of the memory device 610. That is to say, the memory module 600 may supply the first power supply voltage VPP as the first memory power supply voltage MVPP each time the memory device 610 periodically performs a refresh operation during a standby operation.

In FIG. 6, the memory module 600 may include a module controller 620, and a voltage gating circuit 630. The module controller 620 and the voltage gating circuit 630 may be applied as the power controller 120 shown in FIG. 1. The module controller 620 may generate at least one of a gating signal GC and a refresh signal REF based on the command signal CMD received from outside the memory module 600. The module controller 620 may determine whether to enable the gating signal GC, depending on the operation of the memory device 610 based on the command signal CMD. For example, the module controller 620 may enable the gating signal GC in the active operation of the memory device 610 and may disable the gating signal GC in the standby operation of the memory device 610. The module controller 620 may enable the gating signal GC when the refresh operation is performed during the standby operation. The module controller 620 may generate the refresh signal REF in the refresh operation, and may provide the refresh signal REF to the memory device 610 by sensing a level of the first memory power supply voltage MVPP.

The voltage gating circuit 630 may provide the first power supply voltage VPP as the first memory power supply voltage MVPP based on the gating signal GC. For example, the voltage gating circuit 630 may provide the first power supply voltage VPP as the first memory power supply voltage MVPP when the gating signal GC is an enabled state, and may possibly not provide the first power supply voltage VPP as the first memory power supply voltage MVPP when the gating signal GC is a disabled state. The voltage gating circuit 630 may provide one of the first power supply voltage VPP and a low voltage as the first memory power supply voltage MVPP based on the gating signal GC. The voltage gating circuit 630 may provide the first power supply voltage VPP as the first memory power supply voltage MVPP when the gating signal GC is the enabled state, and may provide the low voltage as the first memory power supply voltage MVPP when the gating signal GC is the disabled state. The low voltage may have a lower level than the first power supply voltage VPP. Descriptions will be made later for the low voltage.

In FIG. 6, the module controller 620 may include a voltage sensing circuit 621 and a power control circuit 622. The voltage sensing circuit 621 may receive the first memory power supply voltage MVPP, sense the first memory power supply voltage MVPP, and generate a sensing signal VPPD. For example, the voltage sensing circuit 621 may enable the sensing signal VPPD when the first memory power supply voltage MVPP is greater than or equal to a predetermined level. The power control circuit 622 may generate the gating signal GC based on the command signal CMD, and generate the refresh signal REF based on the command signal CMD and the sensing signal VPPD. The power control circuit 622 may enable the gating signal GC when the command signal CMD associated with the active operation is received. The power control circuit 622 may disable the gating signal GC when the command signal CMD associated with the standby operation is received. The power control circuit 622 may enable the gating signal GC when the command signal CMD associated with the refresh operation is received during the standby operation. The power control circuit 622 may disable again the gating signal GC when the refresh operation has ended. The power control circuit 622 may generate the refresh signal REF based on the command signal CMD associated with the refresh operation. The power control circuit 622 may provide the refresh signal REF to the memory device 610 when the sensing signal VPPD is enabled. The first power supply voltage VPP may possibly not be provided as the first memory power supply voltage MVPP in the standby operation of the memory device 610. The first power supply voltage VPP may be provided again as the first memory power supply voltage MVPP when the refresh operation is performed. The memory device 610 may perform the refresh operation after the level of the first memory power supply voltage MVPP is stabilized. To this end, the voltage sensing circuit 621 may enable the sensing signal VPPD when the level of the first memory power supply voltage MVPP is stabilized after the first power supply voltage VPP is supplied again, and the power control circuit 622 may provide the refresh signal REF to the memory device 610 after the level of the first memory power supply voltage MVPP is stabilized.

In FIG. 6, the memory device 610 may include a refresh circuit 611. The refresh circuit 611 may perform a refresh operation of the memory device 610. The refresh circuit 611 may perform the refresh operation based on the command signal CMD and/or the refresh signal REF. The refresh circuit 611 may perform the refresh operation when the command signal CMD associated with the refresh operation is received. In an embodiment, the refresh circuit 611 may perform the refresh operation when the refresh signal REF is received. Further, in an embodiment, the refresh circuit 611 may perform the refresh operation when the command signal CMD associated with the refresh operation is received from the host 601 and the refresh signal REF is received from the power control circuit 622. For example, during the active operation of the memory device 610, the refresh circuit 611 may perform the refresh operation based on the command signal CMD associated with the refresh operation. During the standby operation of the memory device 610, the refresh circuit 611 may perform the refresh operation based on the refresh signal REF or may perform the refresh operation when both the command signal CMD associated with the refresh operation and the refresh signal REF are received.

In FIG. 6, the semiconductor system 3 may further include a power source 603. The power source 603 may be in a power management integrated circuit capable of supplying various power supply voltages. The power source 603 may generate the first power supply voltage VPP and supply the first power supply voltage VPP to the memory module 600. The power source 603 may additionally generate a second power supply voltage VDD and supply the second power supply voltage VDD to the memory module 600. The second power supply voltage VDD may be provided and be applied to the memory device 610, as a second memory power supply voltage MVDD. The second power supply voltage VDD may be continuously supplied as the second memory power supply voltage MVDD regardless of the operation of the memory device 610. The memory device 610 may operate by being applied with not only the first memory power supply voltage MVPP but also the second memory power supply voltage MVDD. While it is shown in FIG. 6 that the power source 603 is disposed outside the memory module 600, in an embodiment, the power source 603 may be disposed inside the memory module 600 acting as a component of the memory module 600.

When the memory module 600 includes a plurality of memory devices, the memory module 600 may include a plurality of voltage gating circuits which are coupled with the plurality of memory devices, respectively. Further, the module controller 620 may generate a plurality of refresh signals and a plurality of gating signals based on command signals CMD associated with the plurality of memory devices, respectively. The module controller 620 may or may not generate the plurality of refresh signals and may enable or disable the plurality of gating signals, depending on the operations of the plurality of memory devices, respectively.

Figure 7:
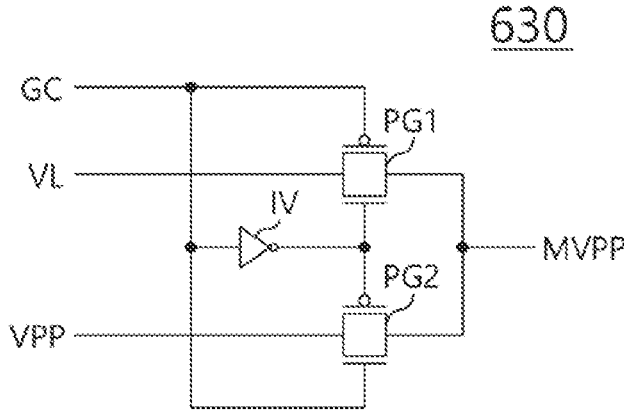
FIG. 7 is a diagram illustrating a representation of an example configuration of the voltage gating circuit shown in FIG. 6.

FIG. 7 is a diagram illustrating a representation of an example configuration of the voltage gating circuit 630 shown in FIG. 6. In FIG. 7, the voltage gating circuit 630 may include an inverter IV, a first pass gate PG1, and a second pass gate PG2. The inverter IV may invert the gating signal GC. The first pass gate PG1 may output a low voltage VL as the first memory power supply voltage MVPP in response to the gating signal GC and the gating signal inverted by the inverter IV. The second pass gate PG2 may output the first power supply voltage VPP as the first memory power supply voltage MVPP in response to the gating signal GC and the gating signal inverted by the inverter IV. When the gating signal GC is enabled to a high level, the second pass gate PG2 may be turned on, and the first power supply voltage VPP may be provided as the first memory power supply voltage MVPP. When the gating signal GC is disabled to a low level, the first pass gate PG1 may be turned on, and the low voltage VL may be provided as the first memory power supply voltage MVPP. As described above, the low voltage VL may have a lower level than the first power supply voltage VPP. For example, the low voltage VL may have any voltage level between a ground voltage and the first power supply voltage VPP. The voltage gating circuit 630 may provide the low voltage VL as the first memory power supply voltage MVPP instead of the first power supply voltage VPP when the gating signal GC is disabled, and thereby, may prevent floating of the first memory power supply voltage MVPP and reduce the power consumed in the memory device 610. In an embodiment, the low voltage may be generated in the memory module 600 by lowering the first power supply voltage VPP. In an embodiment, the low voltage may supplied from the power source 603.

Figure 8:
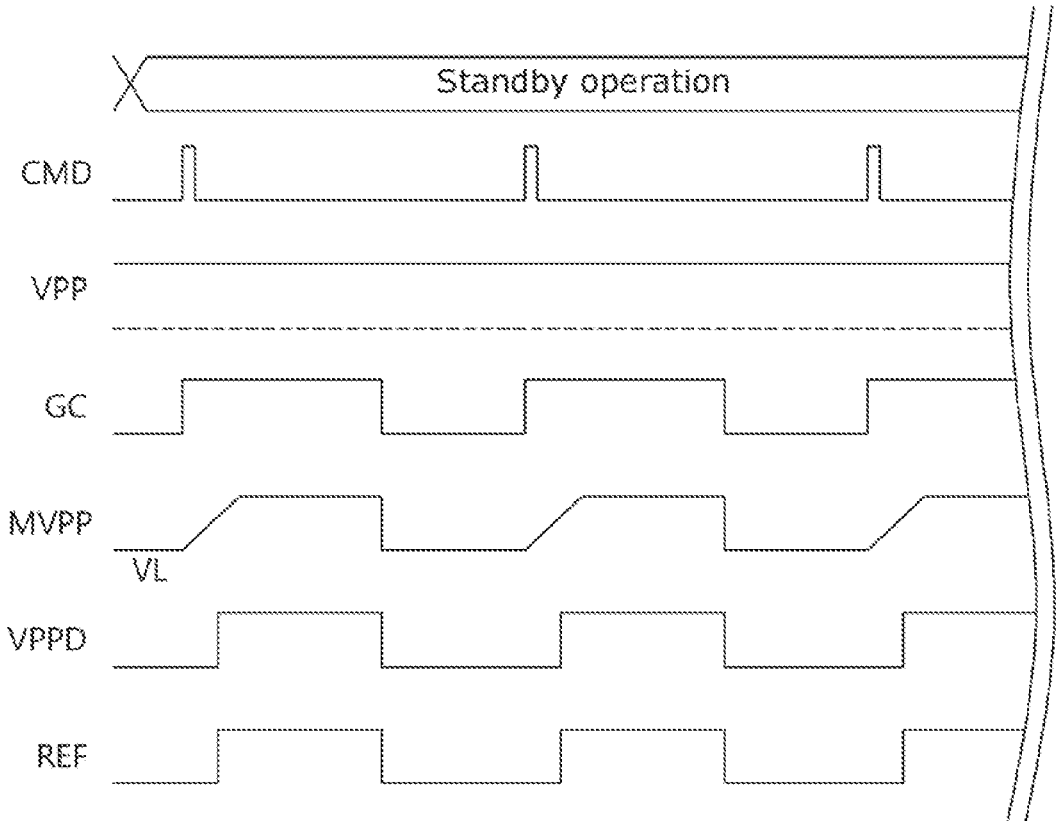
FIG. 8 is a representation of an example timing diagram to assist in an explanation of operations of the memory module and the semiconductor system in accordance with an embodiment.

FIG. 8 is a representation of an example timing diagram to assist in an explanation of operations of the memory module 600 and the semiconductor system 3 in accordance with an embodiment. The operations of the memory module 600 and the semiconductor system 3 in accordance with an embodiment will be described below with reference to FIGS. 6 to 8. The power source 603 may generate the first power supply voltage VPP and the second power supply voltage VDD, and supply the first power supply voltage VPP and the second power supply voltage VDD to the memory module 600. The memory device 610 may enter the standby operation when the command signal CMD associated with the standby operation is received from the host 601. The power control circuit 622 of the module controller 620 may disable the gating signal GC based on the command signal CMD associated with a standby operation of the memory device 610. The voltage gating circuit 630 may provide the low voltage VL as the first memory power supply voltage MVPP instead of the first power supply voltage VPP based on the disabled gating signal GC. Accordingly, because the memory device 610 receives the low voltage VL as the first memory power supply voltage MVPP, the power consumed in the memory device 610 and the memory module 600 may be reduced.

During a standby operation, the refresh operation may be periodically performed. The power control circuit 622 may enable the gating signal GC when the command signal CMD associated with the refresh operation of the memory device 610 is received. Further, the power control circuit 622 may generate the refresh signal REF based on the command signal CMD associated with the refresh operation. The voltage gating circuit 630 may provide the first power supply voltage VPP as the first memory power supply voltage MVPP in response to the enabled gating signal GC. The level of the first memory power supply voltage MVPP may rise from the low voltage VL level as the first power supply voltage VPP is applied. The voltage sensing circuit 621 may enable the sensing signal VPPD when the level of the first memory power supply voltage MVPP becomes greater than or equal to the predetermined level. The power control circuit 622 may transmit the refresh signal REF to the memory device 610 when the sensing signal VPPD is enabled. The refresh circuit 611 of the memory device 610 may perform the refresh operation based on the refresh signal REF. In other words, the refresh operation of the memory device 610 may be performed when the command signal CMD associated with the refresh operation is received, and the level of the first memory power supply voltage MVPP is raised to be greater than or equal to the predetermined level. Therefore, the memory device 610 may perform the refresh operation after the level of the first memory power supply voltage MVPP is stabilized. The memory module 600 may block the first power supply voltage VPP from being supplied to the memory device 610 and the power control circuit 622 may disable the gating signal GC again when the refresh operation is completed. For example, the power control circuit 622 may disable the refresh signal REF and the gating signal GC when a time corresponding to a refresh cycle passes after the command signal CMD associated with the refresh operation is received. The memory module 600 may minimize the power consumed in the memory device 610, by supplying the low voltage VL instead of the first power supply voltage VPP to the memory device 610 in the standby operation of the memory device 610, and may allow the memory device 610 to stably perform the refresh operation, by supplying the first power supply voltage VPP based on the command signal CMD again to the memory device 610 in the refresh operation performed during the standby operation.

Figure 9:
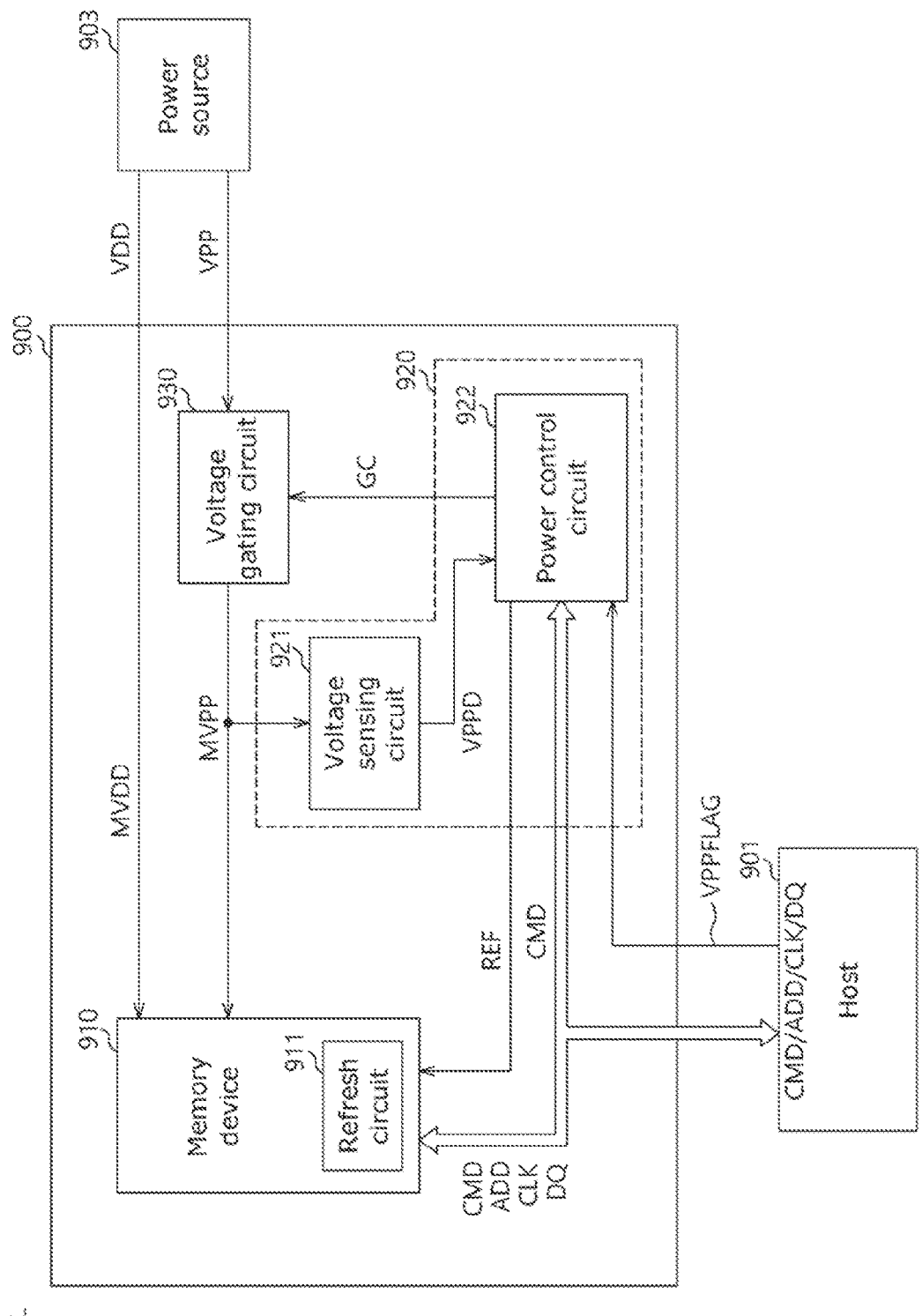
FIG. 9 is a diagram illustrating a representation of an example configuration of a semiconductor system in accordance with an embodiment.

FIG. 9 is a diagram illustrating a representation of an example configuration of a semiconductor system 4 in accordance with an embodiment. In FIG. 9, the semiconductor system 4 may include a host 901, a memory module 900, and a power source 903. The memory module 900 may include a memory device 910, a module controller 920, and a voltage gating circuit 930. The module controller 920 and the voltage gating circuit 930 may be applied as the power controller 120 shown in FIG. 1. The module controller 920 may include a voltage sensing circuit 921 and a power control circuit 922. The semiconductor system 4 includes components substantially the same as those of the semiconductor system 3 shown in FIG. 6. Similar reference numerals will be used to designate the same or similar components, and repeated descriptions of the same components will be omitted herein. The module controller 920 may receive the command signal CMD from the host 901, and may additionally receive a voltage flag VPPFLAG from the host 901. The host 901 may transmit the voltage flag VPPFLAG to the power control circuit 922 before transmitting the command signal CMD associated with the refresh operation. In FIG. 6, the module controller 620 enables the gating signal GC after receiving the command signal CMD associated with the refresh operation, and transfers the refresh signal REF to the memory device 610 after the first memory power supply voltage MVPP level is stabilized. Therefore, a time loss may occur after the command signal CMD associated with the refresh operation is transmitted, and a time for performing the refresh operation within a predetermined refresh cycle may be shortened. In order to solve this problem, in FIG. 9, the host 901 may transmit the voltage flag VPPFLAG to the module controller 920 before transmitting the command signal CMD associated with the refresh operation. The power control circuit 922 of the module controller 920 may enable and generate the gating signal GC based on the voltage flag VPPFLAG, and the voltage gating circuit 930 may also supply the first power supply voltage VPP as the first memory power supply voltage MVPP based on the voltage flag VPPFLAG. Therefore, because the level of the first memory power supply voltage MVPP may be stabilized before the command signal CMD associated with the refresh operation is transmitted, it is possible to prevent time from being lost within the refresh cycle and secure a sufficient refresh operation time.

Figure 10:
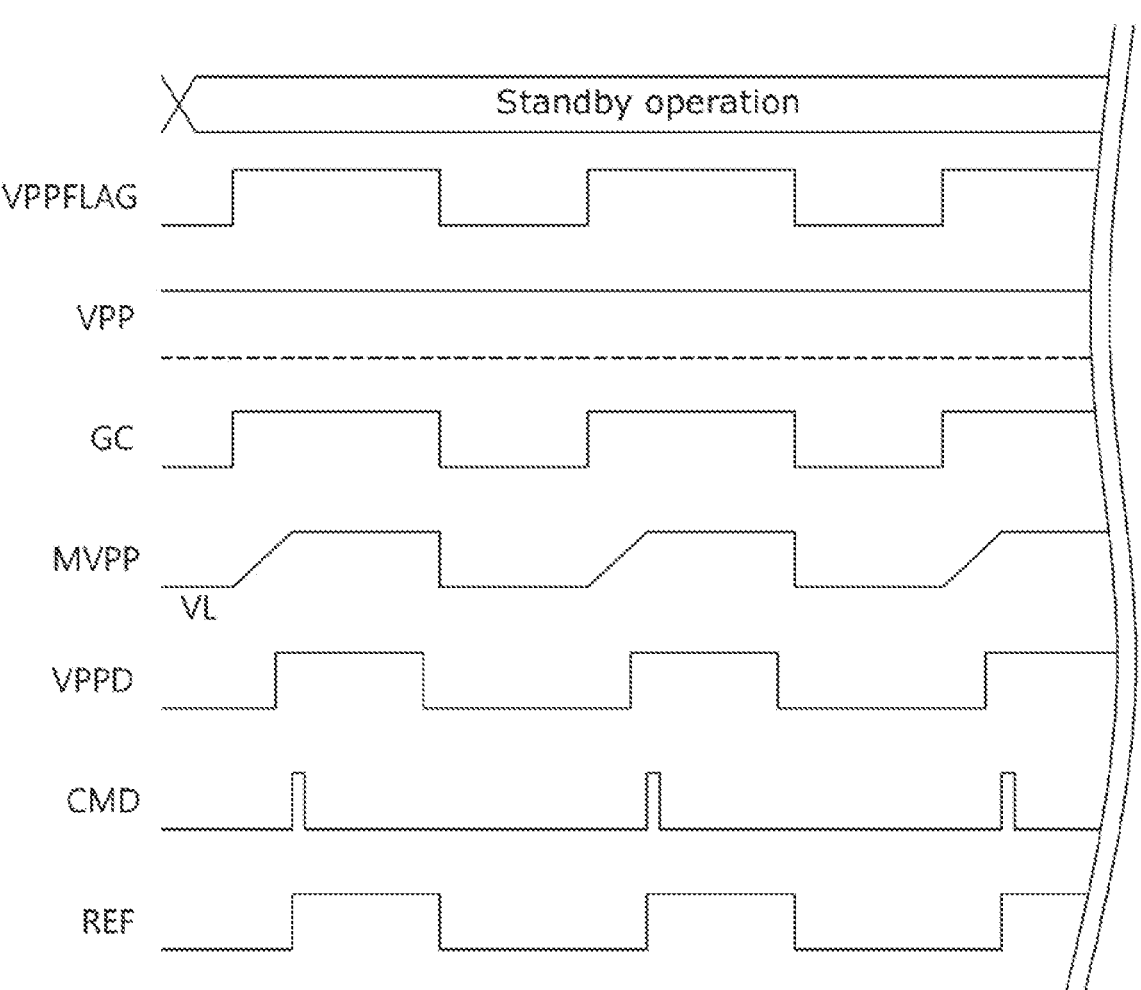
FIG. 10 is a representation of an example timing diagram to assist in an explanation of operations of the memory module and the semiconductor system in accordance with an embodiment.

FIG. 10 is a representation of an example timing diagram to assist in an explanation of operations of the memory module 900 and the semiconductor system 4 in accordance with an embodiment. The operations of the memory module 900 and the semiconductor system 4 in accordance with an embodiment will be described below with reference to FIGS. 9 and 10. In the standby operation of the memory device 910, the power control circuit 922 may disable the gating signal GC based on the command signal CMD associated with the standby operation, and the voltage gating circuit 930 does not provide the first power supply voltage VPP as the first memory power supply voltage MVPP. The power control circuit 922 may enable the gating signal GC when the voltage flag VPPFLAG is received from the host 901, and the voltage gating circuit 930 may provide the first power supply voltage VPP as the first memory power supply voltage MVPP. The level of the first memory power supply voltage MVPP rises as the first power supply voltage VPP is provided as the first memory power supply voltage MVPP, and the voltage sensing circuit 921 may enable the sensing signal VPPD when the level of the first memory power supply voltage MVPP becomes greater than or equal to the predetermined level. The power control circuit 922 may generate the refresh signal REF and transmit the generated refresh signal REF to the memory device 910 when the command signal CMD associated with the refresh operation is received from the host 901. A refresh circuit 911 of the memory device 910 may perform the refresh operation by receiving the refresh signal REF. The memory device 910 may perform the refresh operation by using the first memory power supply voltage MVPP. If the refresh operation has ended, the power control circuit 922 may disable the gating signal GC and the refresh signal REF, and the voltage gating circuit 930 does not provide the first power supply voltage VPP again as the first memory power supply voltage MVPP. The above-described operations may be repeatedly performed each time the refresh operation is performed during the standby operation.

Figure 11:
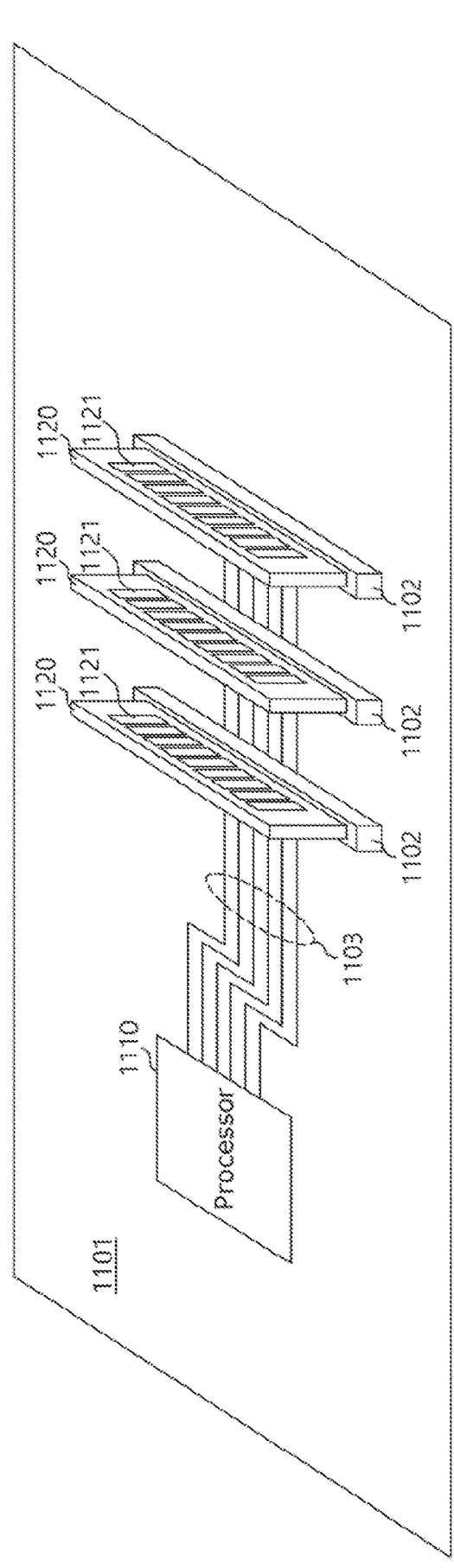
FIG. 11 is a diagram illustrating a representation of an example configuration of a system in accordance with an embodiment.

FIG. 11 is a diagram illustrating a representation of an example configuration of a system 5 in accordance with an embodiment. In FIG. 11, the system 5 may include a main board 1101, a processor 1110, and memory modules 1120.

The main board 1101 acting as a substrate for mounting parts configuring the system 5 may be referred to as a mother board. The main board 1101 may include a slot (not shown) in which the processor 1110 may be mounted and slots 1102 in which the memory modules 1120 may be mounted. The main board 1101 may include wiring lines 1103 for electrically coupling the processor 1110 and the memory modules 1120. The processor 1110 may be mounted to the main board 1101. The processor 1110 may include a central processing unit (CPU), a graphic processing unit (GPU), a multimedia processor (MMP), or a digital signal processor (DSP). Furthermore, the processor 1110 may be realized in the form of a system-on-chip by combining processor chips having various functions, such as application processors (AP).

The memory modules 1120 may be mounted to the main board 1101 through the slots 1102 of the main board 1101. The memory modules 1120 may be coupled with the wiring lines 1103 of the main board 1101 through module pins formed in module substrates and the slots 1102. Each of the memory modules 1120 may include, for example, a UDIMM (unbuffered dual in-line memory module), a DIMM (dual in-line memory module), an RDIMM (registered dual in-line memory module), an LRDIMM (load-reduced dual in-line memory module), an SODIMM (small outline dual in-line memory module), or an NVDIMM (nonvolatile dual in-line memory module). The memory modules 100, 200, 600, and 900 shown in FIGS. 1, 2, 6 and 9 may be applied as the memory modules 1120. Each of the memory modules 1120 may include a plurality of memory devices 1121. Each of the plurality of memory devices 1121 may include at least one of a volatile memory device and a nonvolatile memory device. The volatile memory device may include an SRAM, a DRAM, or an SDRAM, and the nonvolatile memory device may include a ROM, a PROM, an EEPROM, an EPROM, a flash memory, a PRAM, an MRAM, an RRAM, or an FRAM. Moreover, each of the memory devices 1121 may be a stacked memory device or a multi-chip package which is formed as a plurality of chips are stacked.

Figure 12:
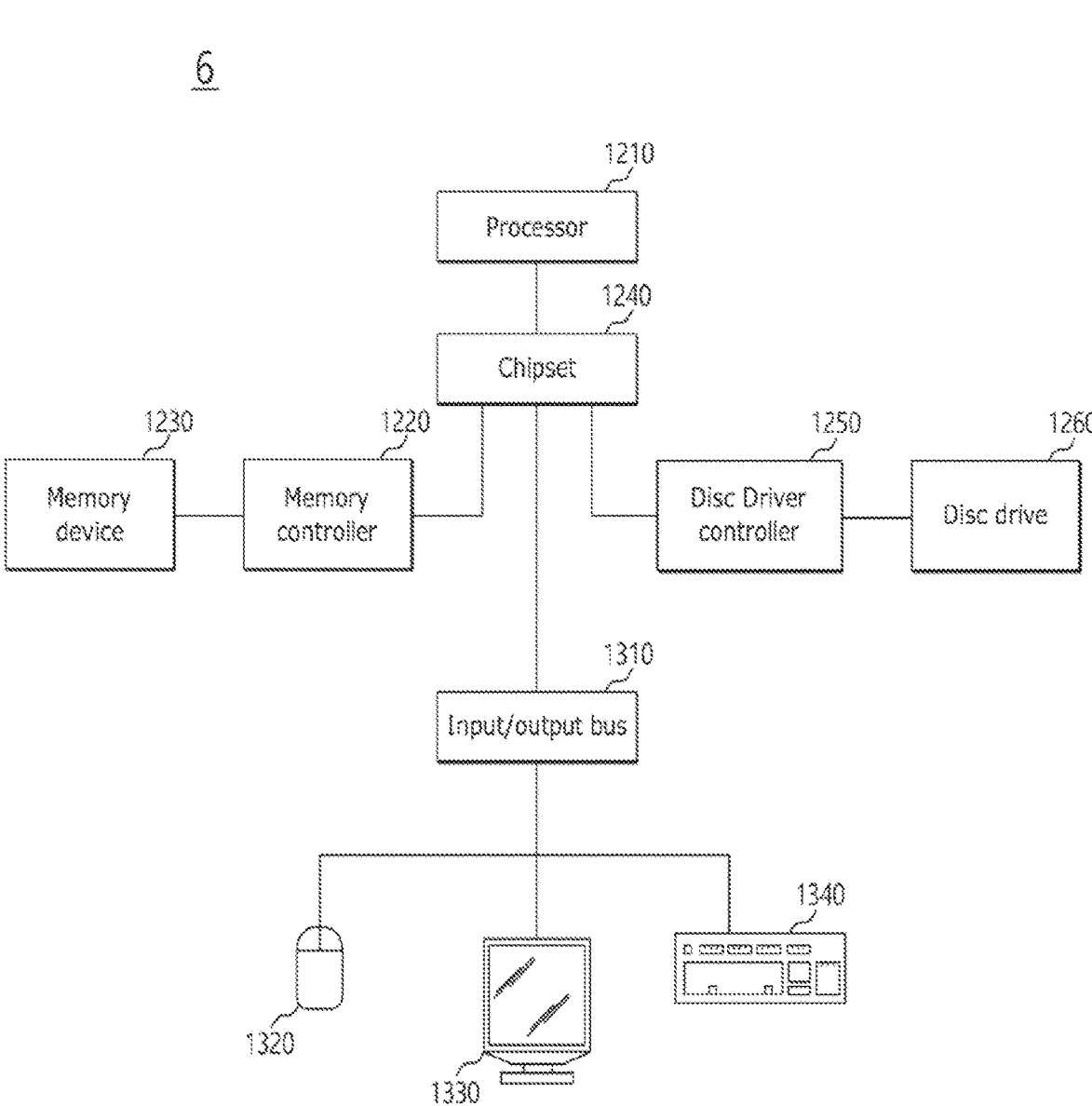
FIG. 12 is a diagram illustrating a representation of an example configuration of a system in accordance with an embodiment.

FIG. 12 is a diagram illustrating a representation of an example configuration of a system 6 in accordance with an embodiment. In FIG. 12, the system 6 may include a processor 1210, a memory controller 1220, and a memory device 1230. The processor 1210 may be coupled with the memory controller 1220 through a chip set 1240, and the memory controller 1220 may be coupled with the memory device 1230 through a plurality of buses. While the processor 1210 is shown in FIG. 12 as being one, it is to be noted that the embodiment is not limited thereto and a plurality of processors may be provided physically or logically. The chip set 1240 may provide communication paths through which signals are transmitted between the processor 1210 and the memory controller 1220. The processor 1210 may perform a computation operation, and may transmit a request and data to the memory controller 1220 through the chip set 1240 to input/output desired data.

The memory controller 1220 may transmit a command signal, an address signal, a clock signal, and data through the plurality of buses. By receiving the signals from the memory controller 1220, the memory device 1230 may store data and output stored data to the memory controller 1220. The memory device 1230 may include at least one memory module, and may adopt the memory modules 100, 200, 600, and 900 shown in FIGS. 1, 2, 6 and 9.

In FIG. 12, the system 6 may further include an input/output bus 1310, input/output devices 1320, 1330, and 1340, a disc driver controller 1250, and a disc drive 1260. The chip set 1240 may be coupled with the input/output bus 1310. The input/output bus 1310 may provide communication paths for transmission of signals from the chip set 1240 to the input/output devices 1320, 1330, and 1340. The input/output devices 1320, 1330, and 1340 may include a mouse 1320, a video display 1330, and a keyboard 1340. The input/output bus 1310 may include any communication protocol communicating with the input/output devices 1320, 1330, and 1340. Further, the input/output bus 1310 may be integrated into the chip set 1240.

The disc driver controller 1250 may operate by being coupled with the chip set 1240. The disc driver controller 1250 may provide communication paths between the chip set 1240 and at least one disc drive 1260. The disc drive 1260 may be utilized as an external data storage device by storing commands and data. The disc driver controller 1250 and the disc drive 1260 may communicate with each other or with the chip set 1240 by using any communication protocol including the input/output bus 1310.

While various embodiments have been described above, it will be understood by those skilled in the art that the embodiments described are examples only. Accordingly, the memory module capable of reducing power consumption and the semiconductor system including the same described herein should not be limited based on the described embodiments.

What is claimed is:

1. A memory module comprising:
a memory device configured to operate by being applied with a first memory power supply voltage, and configured to perform a refresh operation when a refresh signal is received;
a voltage gating circuit configured to provide a first power supply voltage supplied from a power source, as the first memory power supply voltage, when a gating signal is an enabled state;
a voltage sensing circuit configured to generate a sensing signal when a level of the first memory power supply voltage is greater than or equal to a predetermined level; and
a power control circuit configured to generate the gating signal based on a command signal, and generate the refresh signal based on the command signal and the sensing signal.

2. The memory module according to claim 1, wherein the voltage gating circuit supplies one of the first power supply voltage and a low voltage as the first memory power supply voltage based on the gating signal, and the low voltage has a lower level than the first power supply voltage.

3. The memory module according to claim 1, wherein the memory device operates by being additionally applied with a second memory power supply voltage, the power source provides a second power supply voltage as the second memory power supply voltage, and the second power supply voltage has a lower level than the first power supply voltage.

4. The memory module according to claim 1, wherein the power control circuit is configured to enable the gating signal in the refresh operation of the memory device during a standby operation.

5. The memory module according to claim 4, wherein the standby operation includes at least one operation mode among a power-down mode, a deep power-down mode, or a sleep mode.

6. The memory module according to claim 4, wherein, during the standby operation, an internal circuit that performs the refresh operation of the memory device is activated.

7. The memory module according to claim 4, wherein, during the standby operation, an internal circuit that performs the refresh operation of the memory device is activated when the command signal is associated with the refresh operation.

8. The memory module according to claim 4, wherein, during the standby operation, the memory device is configured to perform the refresh operation when the command signal is associated with the refresh operation.

9. The memory module according to claim 4, wherein the power control circuit is configured to disable the gating signal in the standby operation.

10. The memory module according to claim 1, wherein the memory module is coupled to a power management integrated circuit, the power management integrated circuit configured to generate and provide the first power supply voltage, wherein the power management integrated circuit includes the power source.

11. The memory module according to claim 1, wherein the power control circuit is configured to generate the gating signal after the memory module receives the command signal from an exterior of the memory module.

12. The memory module according to claim 1, wherein the power control circuit is configured to generate the gating signal when the command signal is associated with a standby operation.

13. A memory module comprising:

a memory device configured to operate by being applied with a first memory power supply voltage and a second memory power supply voltage;

a voltage gating circuit configured to provide a first power supply voltage supplied from a power source, as the first memory power supply voltage, when a gating signal is an enabled state;

a voltage sensing circuit configured to generate a sensing signal when a level of the first memory power supply voltage is greater than or equal to a predetermined level; and a power control circuit configured to generate the gating signal based on a command signal, and generate a refresh signal based on the command signal and the sensing signal, wherein the power source provides a second power supply voltage as the second memory power supply voltage, and the second power supply voltage has a lower level than the first power supply voltage and a higher level than a ground.

14. The memory module according to claim 13, wherein the voltage gating circuit supplies one of the first power supply voltage and a low voltage as the first memory power supply voltage based on the gating signal, and the low voltage has a lower level than the first power supply voltage.

15. The memory module according to claim 13, wherein the power control circuit is configured to enable the gating signal in the refresh operation of the memory device during a standby operation.

16. The memory module according to claim 15, wherein the standby operation includes at least one operation mode among a power-down mode, a deep power-down mode, or a sleep mode.

17. The memory module according to claim 15, wherein, during the standby operation, an internal circuit that performs the refresh operation of the memory device is activated.

18. The memory module according to claim 15, wherein, during the standby operation, an internal circuit that performs the refresh operation of the memory device is activated when the command signal is associated with the refresh operation.

19. The memory module according to claim 15, wherein, during the standby operation, the memory device is configured to perform the refresh operation when the command signal is associated with the refresh operation.

20. The memory module according to claim 15, wherein the power control circuit is configured to disable the gating signal in the standby operation.

21. The memory module according to claim 13, wherein the memory module is coupled to a power management integrated circuit, the power management integrated circuit configured to generate and provide the first power supply voltage and the second power supply voltage, wherein the power management integrated circuit includes the power source.

22. The memory module according to claim 13, wherein the power control circuit is configured to generate the gating signal after the memory module receives the command signal from an exterior of the memory module.

23. The memory module according to claim 13, wherein the power control circuit is configured to generate the gating signal when the command signal is associated with a standby operation.

24. The memory module according to claim 13, wherein the command signal is received from an exterior of the memory module.

25. The memory module according to claim 13, wherein the power control circuit is configured to enable the gating signal when the command signal is associated with a standby operation.

\* \* \* \* \*